United States Patent [19]

Bachmann et al.

[11] Patent Number: 5,552,327
[45] Date of Patent: Sep. 3, 1996

[54] METHODS FOR MONITORING AND CONTROLLING DEPOSITION AND ETCHING USING P-POLARIZED REFLECTANCE SPECTROSCOPY

[75] Inventors: Klaus J. Bachmann; Nikolaus Dietz; Amy E. Miller, all of Raleigh, N.C.

[73] Assignee: North Carolina State University, Raleigh, N.C.

[21] Appl. No.: 296,694

[22] Filed: Aug. 26, 1994

[51] Int. Cl.[6] .................. H01L 21/306; H01L 21/66; C30B 25/16
[52] U.S. Cl. .................. 437/8; 156/626.1; 427/9; 427/10; 117/85
[58] Field of Search .................. 437/8; 156/626.1; 427/9, 10; 117/85; 118/688

[56] References Cited

U.S. PATENT DOCUMENTS

| | | | |
|---|---|---|---|
| 4,332,833 | 6/1982 | Aspnes et al. | 427/8 |
| 4,826,321 | 5/1989 | Coates et al. | 356/351 |
| 5,091,320 | 2/1992 | Aspnes et al. | 437/8 |
| 5,131,752 | 7/1992 | Yu et al. | 356/369 |
| 5,205,900 | 4/1993 | Inoue et al. | 156/601 |
| 5,229,303 | 7/1993 | Donnelly Jr. et al. | 437/7 |
| 5,277,747 | 1/1994 | Aspnes | 156/626 |
| 5,294,289 | 3/1994 | Heinz et al. | 156/626 |
| 5,313,044 | 5/1994 | Massoud et al. | 219/121.85 |
| 5,354,575 | 10/1994 | Dagenais et al. | 427/10 |
| 5,399,229 | 3/1995 | Stefani et al. | 156/626 |
| 5,403,433 | 4/1995 | Morrison et al. | 156/626 |
| 5,425,839 | 6/1995 | Henck | 156/626.1 |
| 5,463,977 | 11/1995 | Manaoa et al. | 117/85 |
| 5,477,325 | 12/1995 | Miyashita et al. | 356/381 |
| 5,494,697 | 2/1996 | Blamo et al. | 427/10 |

OTHER PUBLICATIONS

Horikoshi, Yoshiji, "*Epitaxial Growth of III–V Compound Semiconductor Thin Flims and Their Device Applications*", Prog. Crystal Growth and Charact., vol. 23, 1991, pp. 73–126.

Kobayashi, Naoki, et al., *Spectral Dependence of Optical Reflection during Flow–Rate Modulation Epitaxy of GaAs by the Surface Photo–Absorption Method,* Japanese Journal of Applied Physics, vol. 29, No. 5, May 1990, pp. L702–L705.

Kobayashi, N. et al. "*In–situ monitoring of GaAs growth process in MOVPE by surface photo–absorption method*", Journal of Crystal Growth, vol. 107, 1991, pp. 62–67.

Horikoshi, Yoshiji, et al., "*Optical investigation of GaAs growth process in molecular beam epitaxy and migration-enhanced epitaxy*", Journal of Crystal Growth, vol. 111, 1991, pp. 200–204.

Kobayashi, Naoki, et al., *In–situ monitoring and control of atomic layer epitaxy by surface photo–absorption,* Thin Solid Films, vol. 225, 1993, pp. 32–39.

Kobayashi, Naoki et al.,"*Optical Investigation on the Growth Process of GaAs during Migration–Enhanced Epitaxy*", Japanese Journal of Applied Physics, vol. 28, No. 11, Nov. 1989, pp. L1880–L1882.

(List continued on next page.)

*Primary Examiner*—Robert Kunemund
*Assistant Examiner*—Matthew Whipple
*Attorney, Agent, or Firm*—Bell, Seltzer, Park & Gibson P.A.

[57] ABSTRACT

Deposition or etching of a layer on a substrate is monitored by impinging P-polarized light on the layer during deposition at an angle which is approximately the Brewster's angle for the substrate, and detecting radiation which is reflected from the structure during deposition. In heterodeposition, a quarter wavelength interference signal having a predetermined periodicity is monitored. Maxima and/or minima in the quarter wavelength ratio are monitored and an amplitude modulated fine signal which is superimposed on the quarter wavelength interference signal is also monitored. The deposition process is controlled based on the monitored quarter wavelength interference signal, ratio of the maxima and/or minima, fine signal, fine signal amplitude modulation and/or combinations thereof by comparing the signals to a reference derived from mathematical models or empirical data. A heterodeposition or etching can also be used to calibrate a homodeposition or etching. Scattered light may also be correlated to the reflected light to reduce the scattering component of the reflected light.

20 Claims, 4 Drawing Sheets

OTHER PUBLICATIONS

Kobayashi, Naoki et al., "*Investigation of Growth Processes in Flow–Rate Modulation Epitaxy and Atomic Layer Epitaxy by New In–Situ Optical Monitoring Method*", citation unknown, 1990, pp. 139–145.

Yamauchi, Yoshiharu, et al., "*In Situ Spectrum Observation of Ga Deposition Process during GaAs Metal–Organic Chemical Vapor Deposition Using Surface Photo–Absorption*", Jpn. J. Appl. Phys., vol. 32, Part 2, No. 10A, 1 Oct. 1993, pp. L1380–L1392.

Uwai, Kunihiko, et al., "*Arsenic Coverages and Surface Structures of As–Stabilized GaAs (001) Surfaces during Metalorganic Chemical Vapor Deposition Observed by Reflectance Difference*", Jpn. J. Appl. Phys., vol. 32, Part 1, No. 12A, Dec. 1993, pp. 5479–5486.

Yamauchi, Yoshiharu, et al., "*Spectral Observation of As–Stabilized GaAs Surfaces in Metal–Organic Chemical Vapor Using Surface Photo–Absorption*", Jpn. J. Appl. Phys. vol. 32, Part 1, No. 8, Aug. 1993, pp. 3363–3369.

Yamauchi, Yoshiharu, et al., "*Decomposition of Arsine and Trimethylarsenic on GaAs Investigated by Surface Photo–Absorption*", Japanese Journal of Applied Physics, vol. 29, No. 8, Aug. 1990, pp. L1353–L1356.

Makimoto, Toshiki, et al., "*In situ Optical Monitoring of the GaAs Growth Process in MOCVD*", Japanese Journal of Applied Physics, vol. 29, No. 2, Feb. 1990, pp. L207–L209.

Dietz, N., et al., "*In–situ Multilayer Film Growth Characterization by Brewster Angle Reflectance Differential Spectroscopy*", Mat. Res. Soc. Symp. Proc., vol. 324, 1994, pp. 27–32.

Dietz, N., et al., "*An optical in–situ method for layer growth characterization*", Applied Surface Science, vol. 69, 1993, pp. 350–354.

Lewerenz, H. J., et al., "*Brewster angle spectroscopy: A new method for characterization of defect levels in semiconductors*", Applied Physics Letters, vol. 59, No. 12, 16 Sep. 1991, pp. 1470–1472.

Dietz, N. et al., "*Simultaneous detection of optical constants $\epsilon_1$ and $\epsilon_2$ by Brewster angle reflectivity measurements*", Applied Physics Letters, vol. 60, No. 19, 11 May 1992, pp. 2403–2405.

Simko, J. P., et al., "*Surface photo–absorption study of the laser–assisted atomic layer epitaxial growth process of GaAs*", Thin Solid Films, vol. 225, 1993, pp. 40–46.

Zama, Hideaki, et al., "*In Situ Monitoring of Optical Reflectance Oscillation in Layer–by–Layer Chemical Vapor Deposition of Oxide Superconductor Films*", Jpn. J. Appl. Phys., vol. 31, Pt. 2, No. 9A, 1992, pp. 1243–1245.

Advertisement, *Film Thickness Monitor* from Tencor Instruments, R&D Magazine, Jun. 1994, p. 25.

Advertisement, *Model 810 Optical Monitor On–Line Monitoring and Control of Optical Properties During Thin Film Coating Processes,* TFI•TELEMARK, citation unknown.

METHODS FOR MONITORING AND CONTROLLING DEPOSITION AND ETCHING USING P-POLARIZED REFLECTANCE SPECTROSCOPY

U.S. GOVERNMENT RIGHTS

This invention was made with government support under Grant No. DMR-92-02210 awarded by the National Science Foundation. The U.S. Government has certain rights in the invention.

FIELD OF THE INVENTION

This invention relates to deposition and etching methods and systems and more particularly to methods and systems for monitoring and controlling deposition or etching.

BACKGROUND OF THE INVENTION

Deposition and etching of a layer (film) on a substrate are widely used processes in corrosion protection, antireflection coatings, enhanced surface hardness and wear resistance, as well as microelectronics and other fields of application. For example, microelectronic device manufacturing typically requires deposition of one or more layers on a substrate. In some processes, a layer is deposited on a substrate of the same material to form a homostructure. In other operations, a layer is deposited on a substrate of a different material to form a heterostructure. Often, the layer and the substrate are monocrystalline, such that homoepitaxial deposition and heteroepitaxial deposition are performed.

The layer to be deposited may be one or more single element semiconductors, compound semiconductors, metals, superconductors or dielectrics. Other materials, such as ferroelectric materials may also be deposited. These depositions produce microelectronic devices such as semiconductor integrated circuit chips, optical devices, and thin film magnetic heads. Often, multiple layers are deposited on a substrate to form a superlattice or other structure. Accordingly, a layer may be deposited directly on a substrate, or indirectly on a substrate by deposition on another layer which itself is formed directly or indirectly on a substrate. Similar considerations and terminology apply to etching processes.

Deposition and etching processes require in situ, real-time monitoring of the growth or shrinkage of the layer which is deposited or etched on the substrate. For example, as the integration density of microelectronic devices continues to increase, and new and exotic materials are introduced into microelectronic manufacturing methods, the monitoring and controlling of deposition and etching becomes even more critical, so that the layer has the desired thickness and the desired electrical, optical and other properties.

Many techniques have been developed to monitor and control deposition. For example, Reflection High Energy Electron Diffraction (RHEED) has been developed to monitor the intensity of diffracted electron beams projected across a substrate face. RHEED has allowed atomic layer controllability of initial epitaxial growth.

Some of these techniques involve optical detection because optical detection is nondestructive of the layer being deposited. For example, Surface Photo Absorption (SPA) has been used to monitor the initial growth of a homoepitaxial layer. In this technique, linearly polarized radiation, whose polarization E vector is perpendicular to the substrate surface (i.e. P-polarized) and whose energy ($E=h\upsilon$) exceeds the energy gap of the semiconductor being monitored, irradiates a (001)-oriented GaAs substrate at a shallow incidence angle of 70°. This is close to the Brewster's angle. The wavelength is selected to lie in the high absorption region to obtain high surface sensitivity. The change in reflection intensity is explained by the absorption of incident light by the surface chemical species.

Many publications describe the use of SPA to measure initial growth of a homoepitaxial deposition of gallium arsenide on a gallium arsenide substrate. See, for example, Horikoshi, Yoshiji, *"Epitaxial Growth of III–V Compound Semiconductor Thin Films and Their Device Applications"*, Prog. Crystal Growth and Charact., Vol. 23, 1991, pp. 73–126; Kobayashi, Naoki, et al., *"Spectral Dependence of Optical Reflection during Flow-Rate Modulation Epitaxy of GaAs by the Surface Photo-Absorption Method"*, Japanese Journal of Applied Physics, Vol. 29, No. 5, May 1990, pp. L702–L705; Kobayashi, N., et al. *"In-situ monitoring of GaAs growth process in MOVPE by surface photo-absorption method"*, Journal of Crystal Growth, Vol. 107, 1991, pp. 62–67; Horikoshi, Yoshiji, et al., *"Optical investigation of GaAs growth process in molecular beam epitaxy and migration-enhanced epitaxy"*, Journal of Crystal Growth, Vol. 111, 1991, pp. 200–204; Kobayashi, Naoki, et al., *"In-situ monitoring and control of atomic layer epitaxy by surface photo-absorption"*, Thin Solid Films, Vol 225, 1993, pp. 32–39; Kobayashi, Naoki, et al., *"Optical Investigation on the Growth Process of GaAs during Migration-Enhanced Epitaxy"*, Japanese Journal of Applied Physics, Vol. 28, No. 11, November 1989, pp. L1880–L1882; Kobayashi, Naoki, et al., *"Investigation of Growth Processes in Flow-Rate Modulation Epitaxy and Atomic Layer Epitaxy by New In-Situ Optical Monitoring Method"*, citation unknown, 1990, pp. 139–145; Yamauchi, Yoshiharu, et al., *"In Situ Spectrum Observation of Ga Deposition Process during GaAs Metal-Organic Chemical Vapor Deposition Using Surface Photo-Absorption"*, Jpn. J. Appl. Phys., Vol. 32, Part. 2, No. 10A, 1 Oct. 1993, pp. L1380–L1392; Uwai, Kunihiko, et al., *"Arsenic Coverages and Surface Structures of As-Stabilized GaAs (001) Surfaces during Metalorganic Chemical Vapor Deposition Observed by Reflectance Difference"*, Jpn. J. Appl. Phys., Vol. 32, Part 1, No. 12A, December 1993, pp. 5479–5486; Yamauchi, Yoshiharu, et al., *"Spectral Observation of As-Stabilized GaAs Surfaces in Metal-Organic Chemical Vapor Deposition Using Surface Photo-Absorption"*, Jpn. J. Appl. Phys. Vol. 32, Part 1, No. 8, August 1993, pp. 3363–3369; Yamauchi, Yoshiharu, et al., *"Decomposition of Arsine and Trimethylarsenic on GaAs Investigated by Surface Photo-Absorption"*, Japanese Journal of Applied Physics, Vol. 29, No. 8, August 1990, pp. L1353–L1356; Makimoto, Toshiki, et al., *"In Situ Optical Monitoring of the GaAs Growth Process in MOCVD"*, Japanese Journal of Applied Physics, Vol. 29, No. 2, February 1990, pp. L207–L209; Simko, J. P., et al., *"Surface photo-absorption study of the laser-assisted atomic layer epitaxial growth process of GaAs"*, Thin Solid Films, Vol. 225, 1993, pp. 40–46; and Zama, Hideaki, et al., *"In Situ Monitoring of Optical Reflectance Oscillation in Layer-by-Layer Chemical Vapor Deposition of Oxide Superconductor Films"*, Jpn. J. Appl. Phys., Vol. 31, Pt. 2, No. 9A, 1992, pp. 1243–1245. See also, Japanese patent application 3-174739 to Kobayashi, et al., published on Jul. 29, 1991.

Coinventor Dietz and H. J. Lewerenz also developed a technique referred to as Brewster's Angle Reflective Spectroscopy (BARS) which is based on the changes of reflectivity of P-polarized light at the substrate Brewster's angle. BARS works at precisely the Brewster's angle of the material being tested. It detects quarter wavelength oscillations in reflected light intensity and thus is theoretically predicted to measure layer thickness. Changes in the reflectivity are large enough to monitor layer growth as well as to reveal the thin film thickness and optical constants of the film. See the publication by Dietz, N., et al. entitled, "*An optical in-situ method for layer growth characterization*", Applied Surface Science, Vol. 69, 1993, pp. 350–354.

The above-described RHEED and SPA techniques are highly sensitive during the initial atomic monolayers of growth. Unfortunately, RHEED loses sensitivity over the entire duration of the growth process. SPA works at energies where the sample under test is strongly absorbing, thus preventing penetration of the light into the bulk of the film being deposited. Consequently, SPA only probes surface properties. SPA does not allow a correlation of the surface induced signal to the bulk properties of the layer, including its thickness. BARS theoretically predicts that quarter wavelength oscillations in reflected light intensity can measure film thickness, but does not predict other useful monitoring and control information can be obtained from the quarter wavelength oscillations.

SUMMARY OF THE INVENTION

It is therefore an object of the invention to provide improved methods and systems for monitoring and controlling deposition and etching of a layer on a substrate.

It is another object of the present invention to provide methods and systems for monitoring and controlling deposition and etching during the initial monolayers of growth and during the entire layer growth.

It is yet another object of the present invention to provide methods and systems for monitoring and controlling depositions which provide data concerning overall layer thickness, as well as data concerning the quality of the deposited or etched layer.

These and other objects are provided, according to the present invention, by systems and methods for monitoring deposition or etching of a layer on a substrate to form a heterostructure, wherein polarized radiation is impinged on the layer during deposition or etching thereof at an angle which is approximately the Brewster's angle for the substrate (i.e. within approximately ±10° of the Brewster's angle), and radiation which is reflected from the heterostructure is detected to produce a quarter wavelength interference signal having a predetermined periodicity. Various components of the quarter wavelength interference signal are monitored during the deposition or etching process to monitor deposition or etching of the layer, including the quality of the layer.

According to one aspect of the invention, extrema (maxima and/or minima) in the quarter wavelength signal are detected and a ratio of predetermined extrema is formulated in order to monitor deposition or etching of the layer including the properties thereof. According to another aspect of the invention, a fine signal which is superimposed on the quarter wavelength interference signal, and which has periodicity which is substantially higher than the predetermined periodicity, is monitored. According to both of the above aspects, the deposition or etching process is controlled based upon the monitored ratio of the extrema, fine signal and combinations thereof, by comparing the signals to reference signals derived from mathematical models or empirical data, and controlling the deposition or etching parameters when the monitored signals deviate from the reference signals.

According to another aspect of the invention, it has been discovered that in a deposition or etching process which involves pulsing of at least one precursor or etchant of the layer in a chamber at a predetermined periodicity to deposit the layer on the substrate, the detected radiation which is reflected from the structure produces an amplitude modulated signal having the predetermined periodicity. The amplitude modulation of the amplitude modulated signal is monitored to monitor and control the deposition or etching of the layer. Amplitude modulation takes place during heteroepitaxial deposition or etching, in which the fine signal which is superimposed on the quarter wavelength interference signal is amplitude modulated, and during homoepitaxial deposition or etching in which the fine signal itself is amplitude modulated.

According to yet another aspect of the present invention, a heterodeposition or etching process can be used to calibrate a homodeposition or etching process. For example, a heterodeposition is first performed and Brewster's angle reflectance measurement signals are obtained to produce a quarter wavelength interference signal having a predetermined periodicity. This quarter wavelength signal having a predetermined periodicity is used to calibrate a heterodeposition. During the heterodeposition, a fine signal is produced which has a periodicity which is substantially higher than the predetermined periodicity. The deposition rate associated with each peak of this superimposed amplitude modulated fine signal is determined by counting the numbers of peaks of the fine signal per quarter wavelength oscillation. In a homoepitaxial process using the same deposition parameters as in the preceding heteroepitaxial deposition process, the same amplitude-modulated fine structure is observed. However, a quarter wavelength interference signal is not produced due to the lack of an interface during homodeposition. The fine signal is calibrated using the predetermined periodicity, so that film growth in addition to the fine structure of film growth can be monitored and controlled. A heteroetching process is also used to calibrate a homoetching process in a similar manner.

It has also been discovered that the detected radiation which is reflected from the structure during deposition will contain a component that is a function of scattering rather than reflection. The scattered light is produced because of surface roughness of the growing layer and interface scattering. According to another aspect of the invention, scattered radiation is also detected and is correlated with the reflected signal to produce a signal. For example, the scattered radiation signal is subtracted from the reflected signal to produce a signal which has a reduced scattering component relative to the reflected signal. The reduced scattering component signal is monitored during deposition, for increased accuracy. Scattered radiation can be detected and correlated in an etching process in a similar manner.

The invention allows deposition and etching to be monitored and controlled during initial growth stages and continued growth stages by monitoring various signals which are obtained from radiation which is reflected from a substrate as a result of Brewster's angle impingement of polarized radiation. A high degree of process control of bulk, interface and surface properties is thereby obtained to satisfy the needs of state of the art manufacturing.

DETAILED DESCRIPTION OF PREFERRED EMBODIMENTS

Figure 1:
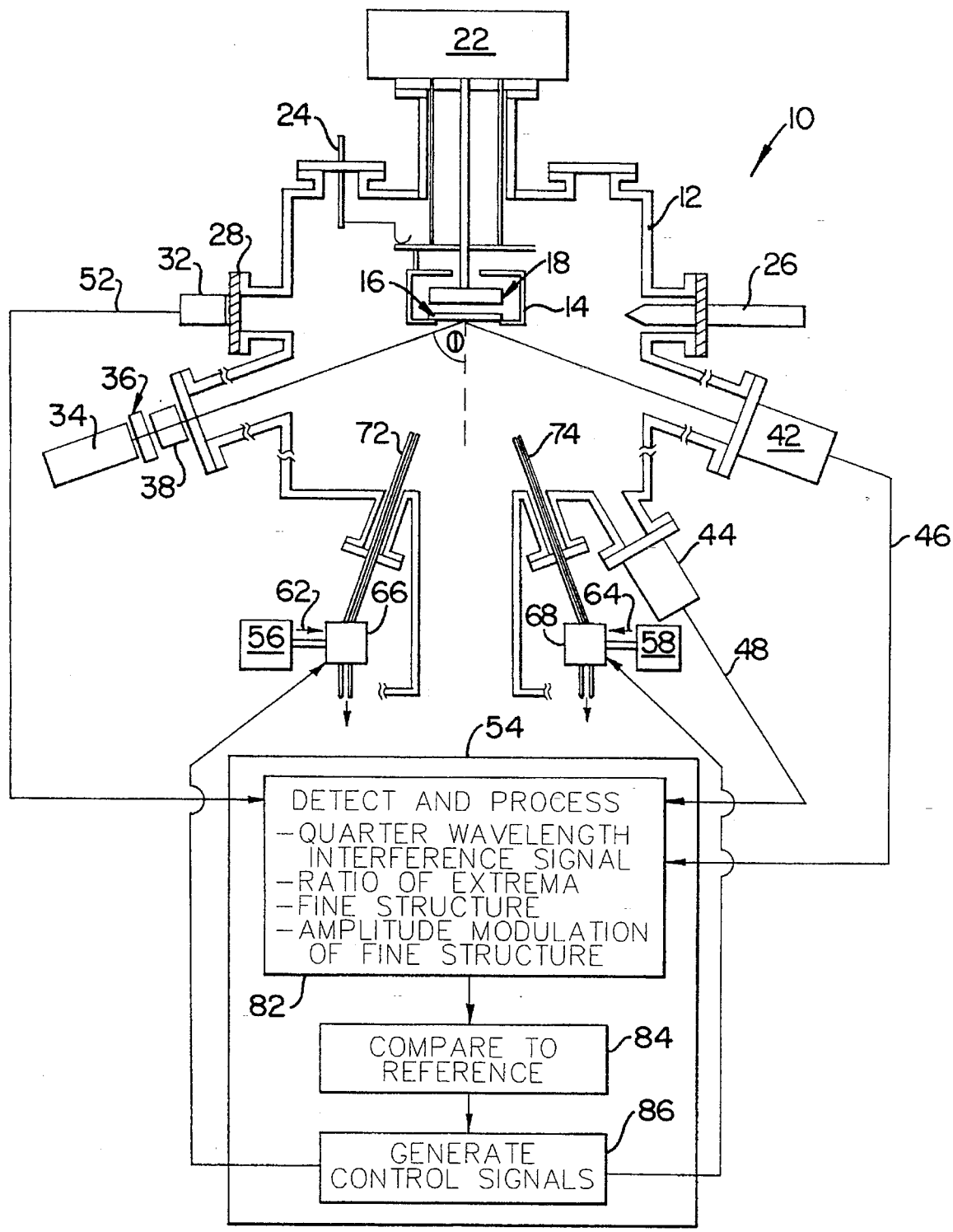
FIG. 1 illustrates a schematic view of a system for monitoring and controlling deposition according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Referring now to FIG. 1, a schematic view of a system for monitoring and controlling deposition using P-Polarized Reflective Spectroscopy (P-PRS) is illustrated. System 10 includes a deposition chamber 12 having a substrate holder 14 therein for holding a substrate 16 thereon. It will be understood by those having skill in the art that substrate 16 can be a silicon or other monocrystalline semiconductor substrate, an optical substrate, or any other kind of solid substrate. A substrate heater 18 may be provided and a linear or rotational motion unit 22 may also be provided to rotate, tilt and move the substrate 16 as necessary. A bias current may also be provided to substrate 16 through current feedthrough 24. An electron gun 26, a RHEED screen 28 and a RHEED detector 32 provide an in situ RHEED monitoring system.

The description of system 10 will now continue with a description of a system for monitoring and controlling gallium phosphide (GAP) deposition on a (001) silicon (Si) substrate by Pulsed Chemical Beam Epitaxy (PCBE). However, this example is merely illustrative, and other layers may be deposited or etched on substrates under varying deposition and etching conditions.

Continuing with the description of FIG. 1, radiation is directed from a radiation source 34 to the substrate 16 at an angle within about ±10° of Brewster's angle $\psi$. In the embodiment described, radiation source 34 is a helium neon laser with a wavelength of 6328 Å, which is below the band gap of GaP. The coherent radiation is chopped by a chopper 36 and is P-polarized by a polarizer 38, for example a Glan-Thompson prism with an extinction ratio better than $10^6$ for the P-polarized component. This generates a P-polarized light beam of 632.8 nm. The radiation irradiates the silicon surface at an angle of incidence $\psi$ equal to 71° which is close to the Brewster's angle of the substrate (about 75°). The angle of incidence can be adjusted in the range of about ±5° to synchronize the RHEED geometry conditions with the P-polarized reflectance spectroscopy measurements.

The parallel polarized light is reflected from the substrate 16 and detected by a reflected light detecting unit 42 such as a silicon photodiode with an integrated preamplifier. Simultaneously, the scattered light component is detected using a scattered light detecting unit 44, such as a sensitive photomultiplier tube. It will be understood that incoherent radiation can also be used.

The reflected radiation signal 46, the scattered radiation signal 48 and the RHEED signal B2 are supplied to a controlling unit 54. It will be understood by those having skill in the art that controlling unit 54 may include specialized hardware, a general purpose computer running a stored program, or combinations thereof. It will also be understood that signals 46, 48 and B2 may be buffered, amplified and/or scaled prior to input into the controlling unit 54.

Still referring to FIG. 1, first and second precursor gas fluxes 62 and 64 are directed from first and second precursor gas sources 56 and 58 respectively, into chamber 12 via computer controlled three-way valves 66 and 68 respectively, or other gas control mechanisms. Valves 66 and 68 direct precursor gases 62 and 64 respectively from sources 56 and 58 respectively into chamber 12 via inlets 72, 74 respectively, or to a separately pumped bypass chamber (not illustrated). Sequential exposure of the substrate to individual pulses of the precursor molecules is thereby obtained. As will be described below, the valves 66 and 68 may be controlled by controlling unit 54.

For example, to deposit gallium phosphide, the precursors used are triethylgallium (TEG) and tertiarybutyl phosphine (TBP) in a hydrogen ambient. The hydrogen scavenges organic molecules formed on the surface of the layer due to pyrolysis of the TEG and TBP molecules. The time constant of the system is limited due to the response time of the switching valves which is on the order of 0.2 seconds. Total gas flow rate in chamber 12 is about 1 to 5 sccm which leads to a pressure in the $10^{-5}$ to low $10^{-4}$ mbar during the deposition. The substrate temperature is between 300°–350° C. As will be described below, the switching of the valves 66, 68 is synchronized with the data acquisition of the reflected radiation signal to relate observed changes in the reflected intensity of the light with the vicinity surface chemistry induced changes in the optical properties.

Controlling unit 54 includes signal processing means 82 which processes the RHEED signal 52, the scattered radiation signal 48 and various components of the reflected radiation signal 46. Among the components of the reflected radiation signal 46 which are detected and processed by signal processing unit 82, are a quarter wavelength interference signal (heterodeposition only), a ratio of extrema of the quarter wavelength interference signal (heterodeposition only), the fine structure of the reflected radiation signal (hetero- and homodeposition) and amplitude modulation of the fine structure (hereto- and homodeposition). The signals are processed by signal processing means 82 as described below.

Once processed, comparing means 84 compares the results to reference signals or parameters. The references may be empirically derived from a reference deposition process, may be theoretically derived using the mathematical equations which govern the deposition process, numerical modelling or combinations thereof. Differences between the reference and the detected signals are used to generate control signals in control signal generating means 86 to control operation of valves 66 and 68 and thereby control the deposition process. It will be understood by those having skill in the art that other components of system 10 may also be controlled, in addition to or instead of valves 66 and 68. It will also be understood that one or more of the processing, comparing and control signal generating functions may be performed manually.

A detailed description of scattered radiation signal 48 and reflected radiation signal 46 will now be provided, along with a detailed description of the operation of controlling unit 54 for processing these signals and generating control signals based thereon.

The reflected radiation signal 46 contains several components which can be divided into bulk and surface vicinity related contributions to the properties. The contribution related to the heteroepitaxial growth of a layer is described by the Fresnel equations for a three component system (ambient/film/substrate). The changes in the amplitude of the reflectance due to growth of a GaP layer were predicted on the order of two to three orders of magnitude with a quarter-wavelength periodicity of about 1060 Å for a He-Ne laser (6328 Å), assuming an angle of incidence of $\psi=75.637°$ and dielectric constants of $\epsilon_{GaP}=(9.95, 0)$ and $\epsilon_{Si}=(15.25, 0.17)$ for GaP and Si, respectively.

The changes in the amplitude of the reflected P-polarized light beam depend strongly on the differences in the dielectric functions of the grown layer and the underlying substrate, respectively. In the case of homoepitaxial film growth, the bulk/film related contribution in the reflected radiation signal vanishes, so that no information over the bulk properties of the growing film are available presupposing identical substrate and film properties with an ideal interface. Only the near-surface contribution to the reflected radiation signal can be still observed, which is related to the surface chemistry induced changes in the dielectric function within the first few monolayers of the growing layer, and interface related phenomena such as a non-ideal interface or chemical reaction of another species with the interface. This contribution can be maintained throughout the entire layer growth.

Figure 2:
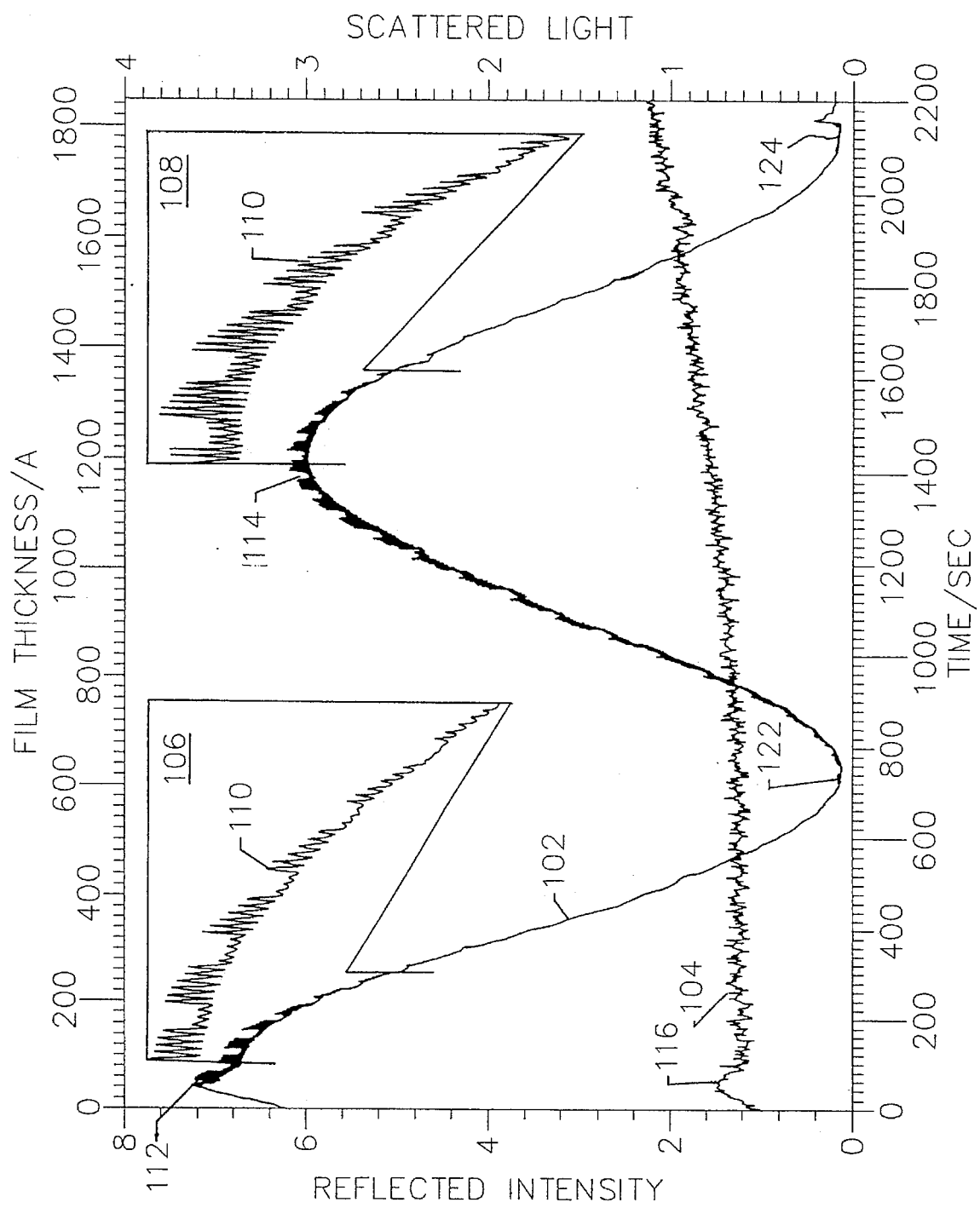
FIG. 2 graphically illustrates a reflected radiation signal and a scattered radiation signal for a heterodeposition according to the present invention.

The experimental results of heteroepitaxial growth of GaP on Si are graphically shown in FIG. 2. The reflected intensity shows the gross quarter wavelength oscillation 102, which is used to terminate the growth of the film as soon as the reflected intensity reaches the second minimum. This corresponds to a film thickness of 1700 Å±50 Å, confirmed by Detak measurements. The error in the thickness is due to the lack of knowledge of the exact value of the angle of incidence and the error in pinpointing the position of the second minimum, which presently relies on a visual inspection of the signal. These errors can be reduced or eliminated by comparison of the experimental data with theoretical model calculations, which can be used to compute the optical constants of the growing layer as well as the deviations in the dielectric function during the growth and an accurate prediction of the position of the minima.

Also shown in FIG. 2, at 104, is the intensity of the scattered light as a function of the growth time. During the initial nucleation period, an increase in the scattered light is observed, which can be related to mechanism of heteroepitaxial nucleation and initial overgrowth, which evolves into the finally observed surface roughness of the epitaxial layer.

The inserts 106, 108 in FIG. 2 show sections of the amplitude modulated fine structure 110 on top of the reflected radiation signal 46 which is maintained throughout the entire layer growth. The periodicity of this fine structure and its amplitude modulation is strongly, related to a complete cycle sequence, which is built up by a TBP pulse of length "a", followed by a delay "x", a TEG pulse of length "b" and a second delay of the length "y". Best deposition conditions are found for a pulse width ratio a:b=0.8:0.2 with a flow rate ratio for TBP:TEG of 0.5:0.06 sccm, which results in a total dose ratio of 25:1 for TBP and TEG, respectively.

Figure 3A:
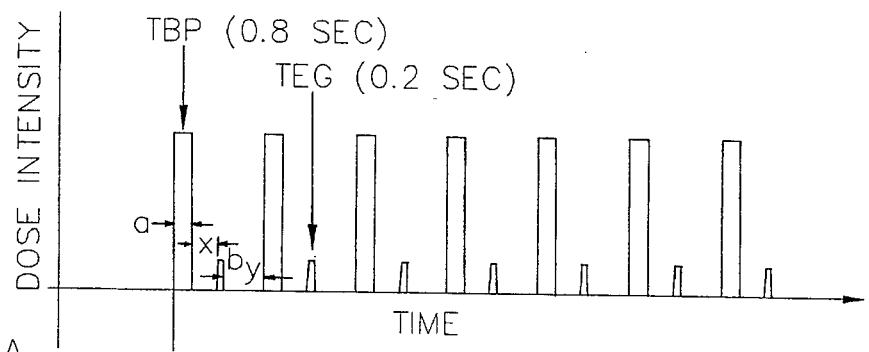
FIGS. 3A and FIG. 3B graphically illustrate a precursor pulse sequence and the corresponding fine signal structure respectively according to the present invention.
Figure 3B:
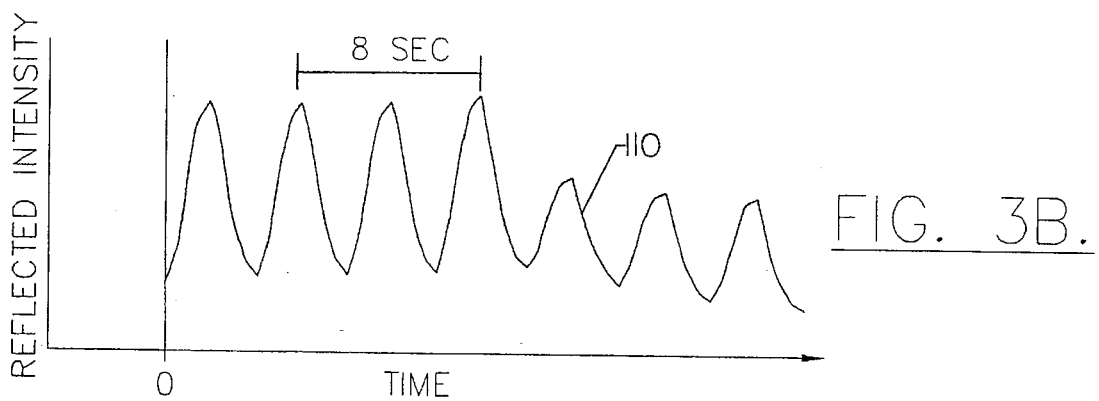

FIG. 3A graphically illustrates a pulse sequence for the TBP and TEG sources with a delay of 3 sec (x:y=1.2 sec:1.8 sec). During the entire deposition, a constant flow of hydrogen is introduced. The growth rate per cycle can be calculated from the overall growth of the entire film and is estimated to be 3.18±0.1 Å/cycle. FIG. 3B graphically illustrates the corresponding reflected intensity signal, and illustrates the fine structure 110 of FIG. 2.

Figure 4:
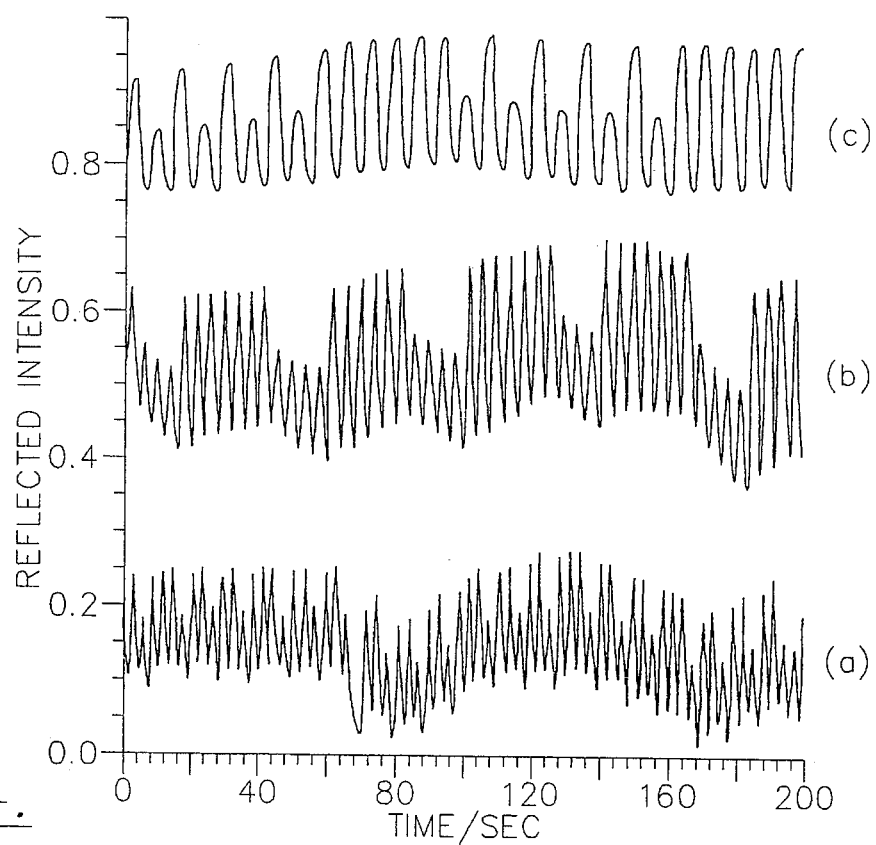
FIG. 4 graphically illustrates amplitude modulation of the fine signal structure of a reflected radiation signal according to the present invention.

Varying the total delay times between the source pulses results in different growth times per cycle sequence from 2 Å/cycle to 3.6 Å/cycle for 0.5 sec to 6 sec delay, respectively. The observed amplitude modulated fine structure changes according to the change in the growth rate per cycle, shown as graphs (a)–(c) in FIG. 4. FIG. 4 shows the periodicity for 2 sec (a), 3 sec (b) and 6 sec delay (c) between the source pulses of the same precursor. Initial results indicate a close relationship of growth rate per cycle and the length of the amplitude modulated fine structure, which may be correlated to a periodic reproduction of the original surface topography.

Accordingly, in the case of heteroepitaxy, a quarter wavelength modulation 102 of the intensity of the reflected radiation signal is observed, which contains information concerning the evolution of the optical properties as well as a record of the growth rate for the entire duration of layer deposition. Changes in the extrema (maxima 112, 114 and/or minima 122, 124) of this signal provide information about deviations in bulk dielectric properties of the growing layer caused by absorption and inhomogeneities in the refractive index of the layer as well as changes in the surface roughness.

Furthermore, under the conditions of Pulsed Chemical Beam Epitaxy (PCBE), the reflected intensity contains a periodic oscillation 110 that is superimposed on the quarter wavelength interference signal 102 with an Å scale period, and is maintained over thousands of Å of film growth. The periodicity of this fine structure 110 matches the period of the sequence of precursor pulses of the PCBE process. Also, an amplitude modulation of the superimposed oscillation is observed which may be understood on the basis of the results of Brewster's angle reflection spectroscopy studies of homoepitaxial growth. This amplitude modulation is best illustrated in FIG. 4 described below.

Under the conditions of homoepitaxy, the quarter wavelength oscillations 102 in the reflected radiation signal cease to exist since the epitaxial layer and the substrate have the same dielectric function. However, the fine structure 110 can still be observed and may be utilized for analysis of the growth mechanism. Moreover, in conjunction with the observation of heteroepitaxial growth for the same material, real-time monitoring of the growth rate may be obtained.

In particular, growth of a first layer of a first material on a first substrate of the first material to form a homostructure is monitored by first depositing a second layer of the first material on a second substrate of a second material to form a heterostructure. Polarized radiation is impinged on the second layer during deposition thereof on the second substrate at an angle which is approximately equal to the Brewster's angle for the second substrate. Radiation which is detected from the heterostructure during the deposition is detected to produce a quarter wavelength interference signal 102 having a predetermined periodicity. Then, the first layer is deposited on the first substrate to form a homostructure.

During this deposition, polarized radiation is impinged on the first layer during deposition thereof on the first substrate at an angle which is approximately equal to the Brewster's angle for the first substrate. Radiation which is reflected from the homostructure is detected to produce a fine signal 110 which has a periodicity which is substantially higher than the predetermined periodicity of the quarter wavelength signal 102. The fine signal 110 is then calibrated using the predetermined periodicity of the quarter wavelength interference signal 102 and the calibrated fine signal is monitored during the deposition to monitor growth of the first layer.

The intensity of the maxima 112, 114 in the reflected radiation signal is determined by absorption in the film and by scattering of the laser beam at its surface. Accordingly, extrema in the quarter wavelength interference signal are detected and a ratio of selected extrema is formulated. For example, a ratio of adjacent maxima is formulated. If this ratio deviates by more than a predetermined threshold value from unity, there may be an indication that the growth is proceeding unsatisfactorily, and the deposition process may be terminated. Alternatively, the deviation signal may be used to change control parameters of the growth process to control the ratio to a predetermined value.

Since absorption also affects the residual reflectance at the position of the minima 122, 124 in the reflected radiation signal, which in the experiment depicted in FIG. 2 does not change significantly, the reduction of the intensity between adjacent maxima 112, 114 shown in FIG. 2 is primarily caused by scattering. This is in accord with the observation of increasing intensity of the associated scattered light (104 in FIG. 2) with increasing growth time/film thickness.

Accordingly, growth of a layer on a substrate in a chamber to form a structure is monitored by pulsing at least one precursor of the layer in the chamber at a predetermined periodicity to deposit the layer on the substrate. Polarized radiation is impinged on the layer during deposition thereof on the substrate at an angle which is approximately equal to the Brewster's angle for the substrate. Radiation which is reflected from the structure during deposition of the layer is detected to produce a first signal having the predetermined periodicity. Radiation which is scattered from the structure during deposition is also detected to produce a second signal. The first and second signals are correlated to produce a third signal having a reduced scattering component relative to the first signal. This third signal is then monitored during deposition to monitor growth of the layer. Note that at the onset of heteroepitaxial growth, a peak 116 is observed in the scattered light intensity trace, which provides information on the initial nucleation and overgrowth phase of the heteroepitaxial process.

Still referring to FIG. 2, an amplitude-modulated periodic fine structure on the reflected intensity that is particularly pronounced on the rising slope and maxima of the quarter wavelength modulated signal is maintained over the entire duration of layer growth. The period of this fine structure and of its amplitude modulation do not change between adjacent maxima at quarter wavelength distance, as illustrated in the expanded insets 106, 108 in FIG. 2. Each peak in the fine structure corresponds to a specific cycle of the precursor sequence that starts with a TBP pulse and is followed by a pause of fixed duration, a TEG pulse and a second pause of another fixed duration.

Figure 5:
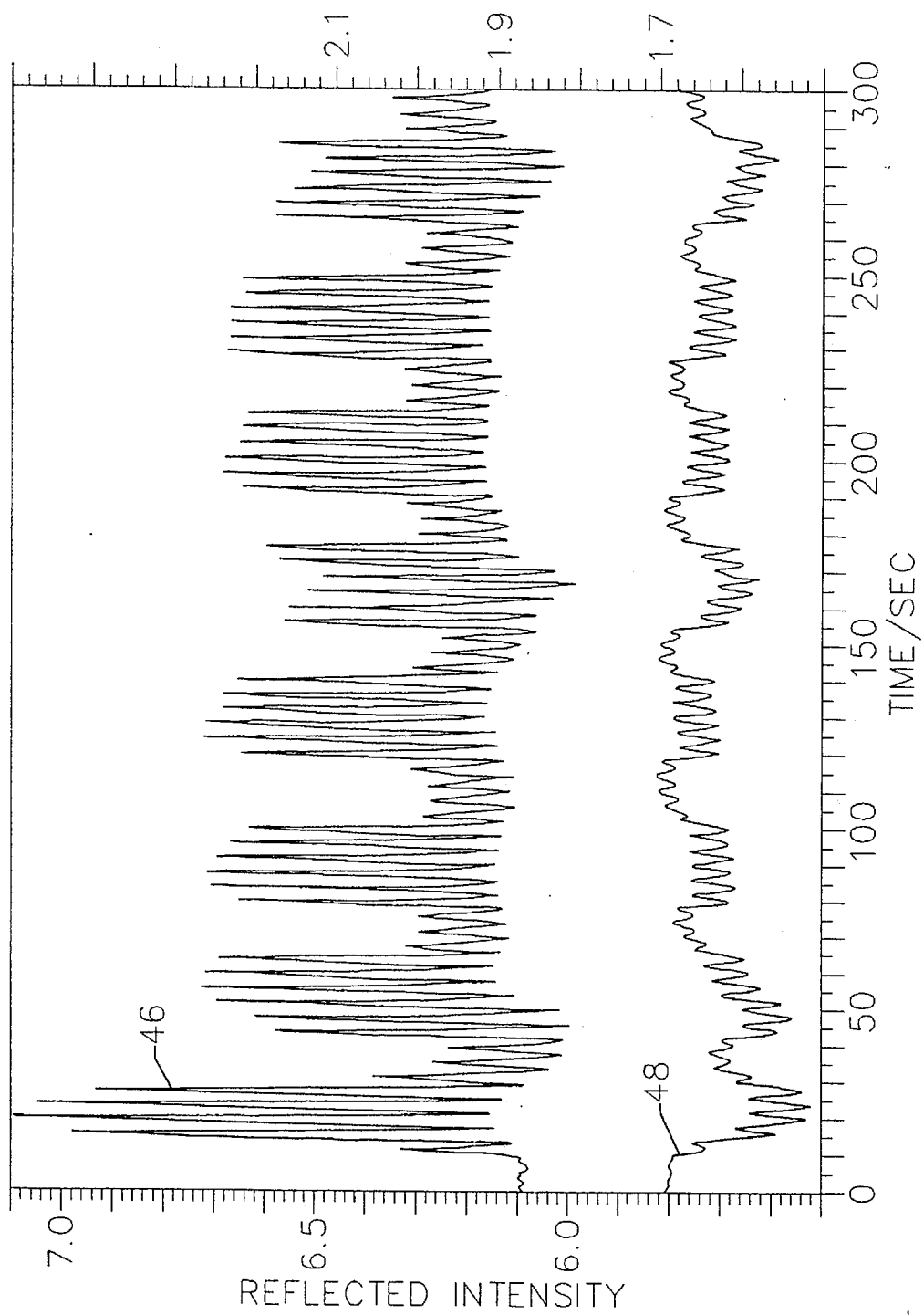
FIG. 5 graphically illustrates a reflected radiation signal and a scattered radiation signal for a homodeposition according to the present invention.

Under the conditions of homoepitaxy, the quarter wavelength modulation vanishes because of the absence of interference in the homoepitaxial film, but the fine structure that is related to the changes in the optical properties in the vicinity of the surface is maintained. The fine structure of the quarter wavelength oscillations is also maintained under conditions of heteroepitaxy. This effect may be modeled assuming a very thin surface layer with a dielectric function that differs from the underlying film, extending the model to a multilayer stack. FIG. 5 shows the reflected radiation signal 46 and the scattered light signal 48 for the initial stage of GaP homoepitaxy on a GaP (001) substrate wafer. Both the reflected and the scattered light signals show amplitude modulations that are correlated, indicating that the amplitude in the fine structure is related to cyclic changes in the surface structure at a scale that is commensurate with the scattering process. The amplitude modulation of the amplitude modulated reflected radiation signal is detected and compared to a reference to monitor growth during deposition.

Accordingly, the evolution of the bulk properties and growth rate are monitored using the periodic structure in the reflectance based on interference in the layer and on the residual minimum reflectance due to both absorption and shifts in the Brewster's angle position that are associated with the changes in the imaginary and real parts of the dielectric function upon heteroepitaxial film growth. The evolution of the surface properties is monitored by the periodic fine structure in the intensity of the P-polarized reflected light, which is correlated with the switching cycles of the metal-organic precursor pulses and is amplitude-modulated in accord with the repeat cycle of the heteroepitaxial growth process.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of monitoring deposition or etching of a layer on a substrate to form a heterostructure, comprising the steps of:

impinging polarized radiation on said layer during deposition or etching thereof on said substrate, at an angle which is approximately the Brewster's angle for said substrate;

detecting radiation which is reflected from said heterostructure during said deposition or etching of said layer to produce a quarter wavelength interference signal having a periodicity;

detecting extrema in said quarter wavelength interference signal; and calculating a ratio of selected extrema to monitor deposition or etching of said layer.

2. A method according to claim 1 wherein said monitoring step is followed by the step of controlling said deposition or etching of said layer on said substrate based upon said ratio of extrema.

3. A method according to claim 2 wherein said controlling step comprises the steps of:

comparing the ratio of extrema to a reference; and controlling said deposition or etching based upon differences between the ratio of extrema and the reference.

4. A method of monitoring deposition or etching of a layer on a substrate to form a heterostructure, comprising the steps of:

impinging polarized radiation on said layer during deposition or etching thereof on said substrate, at an angle which is approximately the Brewster's angle for said substrate;

detecting radiation which is reflected from said heterostructure during said deposition or etching of said layer to produce a quarter wavelength interference signal having a periodicity; and detecting a fine signal which is superimposed on said quarter wavelength interference signal and which has periodicity substantially higher than said periodicity of said quarter wavelength interference signal, to thereby monitor deposition or etching of said layer on a substrate.

5. A method according to claim 4 wherein said fine signal detecting step is followed by the step of controlling said deposition or etching of said layer on said substrate based upon said fine signal.

6. A method according to claim 5 wherein said controlling step comprises the steps of:

comparing the monitored fine signal to a reference; and controlling said deposition or etching based upon differences between the compared fine signal and the reference.

7. A method of monitoring deposition or etching of a layer on a substrate in a chamber to form a structure, comprising the steps of:

pulsing at least one precursor or etchant of said layer in said chamber at a periodicity to deposit or etch said layer on said substrate;

impinging polarized radiation on said layer during deposition or etching thereof on said substrate, at an angle which is approximately the Brewster's angle for said substrate;

detecting radiation which is reflected from said structure during said deposition or etching of said layer to produce an amplitude modulated signal having said periodicity; and monitoring the amplitude modulation of said amplitude modulated signal during said deposition or etching.

8. A method according to claim 7 wherein said layer is different from said substrate to produce a heterostructure, and wherein said detecting step comprises the step of detecting radiation which is reflected from said heterostructure during said deposition or etching of said layer to produce a quarter wavelength interference signal having a second periodicity and including said amplitude modulated signal superimposed thereon, wherein said periodicity of said amplitude modulated signal is substantially greater than said second periodicity.

9. A method according to claim 8 wherein said monitoring step further comprises the steps of:

detecting extrema in said quarter wavelength interference signal; and monitoring a ratio of selected extrema.

10. A method according to claim 7 wherein said monitoring step is followed by the step of controlling said deposition or etching of said layer on said substrate based upon said monitored amplitude modulation of said amplitude modulated signal.

11. A method according to claim 10 wherein said controlling step comprises the steps of:

comparing the monitored amplitude modulated signal to a reference; and controlling said deposition or etching based upon differences between the compared amplitude modulated signal and the reference.

12. A method of monitoring deposition or etching of a first layer of a first material on a first substrate of said first material to form a homostructure, comprising the steps of:

depositing or etching a second layer of said first material on a second substrate of a second material to form a heterostructure;

impinging polarized radiation on said second layer during deposition or etching thereof on said second substrate, at an angle which is approximately the Brewster's angle for said second substrate;

detecting radiation which is reflected from said heterostructure during said deposition or etching to produce a quarter wavelength interference signal having a periodicity;

depositing or etching said first layer on said first substrate to form a homostructure;

impinging polarized radiation on said first layer during deposition or etching thereof on said first substrate, at an angle which is approximately equal to the Brewster's angle for said first substrate;

detecting radiation which is reflected from said homostructure during said deposition or etching to produce a fine signal which has a periodicity which is substantially higher than said periodicity of said quarter wavelength interference signal;

calibrating said fine signal using said periodicity of said quarter wavelength interference signal; and monitoring the calibrated fine signal during said deposition or etching.

13. A method according to claim 12 wherein said monitoring step is followed by the step of controlling said deposition or etching of said first layer on said first substrate based upon said monitored calibrated fine signal.

14. A method according to claim 13 wherein said controlling step comprises the steps of:

comparing the monitored calibrated fine signal to a reference; and controlling said deposition or etching based upon differences between the compared calibrated fine signal and the reference.

15. A method of monitoring deposition or etching of a layer on a substrate in a chamber to form a structure, comprising the steps of:

pulsing at least one precursor or etchant of said layer in said chamber at a periodicity to deposit or etch said layer on said substrate;

impinging polarized radiation on said layer during deposition or etching thereof on said substrate, at an angle which is approximately the Brewster's angle for said substrate;

detecting radiation which is reflected from said structure during said deposition or etching of said layer to produce a first signal having said periodicity;

detecting radiation which is scattered from said structure during deposition or etching of said layer to produce a second signal;

correlating said first and second signals to produce a third signal; and monitoring said third signal during said deposition to monitor deposition or etching of said layer.

16. A method according to claim 15 wherein said correlating step comprises the step of subtracting said second signal from said first signal to produce said third signal having reduced scattering component relative to said first signal.

17. A method according to claim 15 wherein said layer is different from said substrate to produce a heterostructure, and wherein said reflected radiation detecting step comprises the step of detecting radiation which is reflected from said heterostructure during said deposition or etching of said layer to produce a quarter wavelength interference signal having a second periodicity and including said first signal superimposed thereon, wherein said periodicity of said first signal is substantially greater than said second periodicity.

18. A method according to claim 15 wherein said monitoring step comprises the steps of:

detecting extrema in said third signal; and monitoring a ratio of selected extrema to monitor deposition or etching of said layer.

19. A method according to claim 15 wherein said monitoring step is followed by the step of controlling said deposition or etching of said layer on said substrate based upon said monitored third signal.

20. A method according to claim 19 wherein said controlling step comprises the steps of:

comparing the monitored third signal to a reference; and controlling said deposition or etching based upon differences between the compared third signal and the reference.

* * * * *